US006911111B2

(12) United States Patent
Chopra et al.

(10) Patent No.: US 6,911,111 B2
(45) Date of Patent: *Jun. 28, 2005

(54) INLINE MONITORING OF PAD LOADING FOR CUCMP AND DEVELOPING AN ENDPOINT TECHNIQUE FOR CLEANING

(75) Inventors: Dinesh Chopra, Boise, ID (US); Scott Meikle, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/842,583

(22) Filed: May 10, 2004

(65) Prior Publication Data

US 2004/0206454 A1 Oct. 21, 2004

Related U.S. Application Data

(63) Continuation of application No. 09/973,854, filed on Oct. 9, 2001, now Pat. No. 6,736,926.

(51) Int. Cl.[7] ........................... C23F 1/00; H01L 21/306
(52) U.S. Cl. ................................................. 156/345.13
(58) Field of Search ....................... 156/345.12, 345.13, 156/345.16; 134/113, 104.1; 451/66, 443, 444

(56) References Cited

U.S. PATENT DOCUMENTS

| 5,823,854 | A | 10/1998 | Chen | |
|---|---|---|---|---|
| 6,605,159 | B2 | 8/2003 | Joslyn | |
| 6,736,926 | B2 * | 5/2004 | Chopra et al. | 156/345.13 |

OTHER PUBLICATIONS

Dinesh Chopra and Ian Ivar Suni, "An Optical Method for Monitoring Metal Contamination during Aqueous Processing of Silicon Wafers.", *J. Electrochem. Soc.*, vol. 145, No. 5, May 1998, pp. 1688–1692.

Dinesh Chopra, Ian Ivar Suni and Ahmed A. Busnaina, "Cu Dissolution from Si(111) into an SC–1 Process Solution", *J. Electrochem. Soc.*, vol. 145, No. 4, Apr. 1998, pp. L60–61.

(Continued)

*Primary Examiner*—P. Hassanzadeh
*Assistant Examiner*—Sylvia R. MacArthur
(74) *Attorney, Agent, or Firm*—Knobbe, Martens, Olson & Bear, LLP

(57) ABSTRACT

A system of cleaning a CMP pad used for removing copper from a substrate, the system comprising an abrasive cleaning pad, a cleaning solution delivery system that delivers a cleaning solution, an analyzing system that monitors the characteristics of the cleaning solution optically and chemically, and a carriage that allows the analyzing system to monitor the cleaning solution at a plurality of locations on the CMP pad. The use of the abrasive cleaning pad and the cleaning solution removes contaminants from the CMP pad, and the contaminants are dissolved in the cleaning solution. By measuring the concentration of contaminants in the cleaning solution, the condition of the CMP pad can be monitored. To measure the concentration of the contaminants, changes in the refractive index and absorption of light in the cleaning solution are measured, wherein the refractive index and absorption depend on the concentration of the contaminants. The concentration of the contaminants in the cleaning solution is also measured chemically. Knowing the actual condition of the CMP pad during the cleaning process allows for improved condition of the CMP pad.

21 Claims, 9 Drawing Sheets

OTHER PUBLICATIONS

Peter Singer, Editor–in–Chief, "Copper CMP: A Question of Tradeoffs", Semiconductor International, http://www.semiconductor.net/semiconductor/issues/issues/2000/200005/six0005cmp.asp, May 2000, 11 pages.

"The CMP Business Unit", Rodel Products, http://www.rodel.com/Products/CMP.asp, 1998–2000, 13 pages.

Kurt Hery and Dr. David P. Norwood, "Study of the Refractive Index Increment of Polyelectrolytes and Neutral Polymers", Southeastern Louisiana University, http://www.selu.edu/Academics/ArtsC/Sciences/connections/journal1/k-hery/Hery.html, 7 pages.

Iqbal Ali and Sudipto R. Roy, "Pad conditioning in interlayer dielectric CMP", Texas Instruments, http://www.semipark.co . . . /Pad%20conditioning%20in%20interlayer%20dielectric%20CMP.ht, Jun. 1, 1997, 6 pages.

"Chemical Mechanical Planarization (CMP)", S.C. Solutions, http//www.scsolutions.com/smp.html, 4 pages.

* cited by examiner

INLINE MONITORING OF PAD LOADING FOR CUCMP AND DEVELOPING AN ENDPOINT TECHNIQUE FOR CLEANING

PRIORITY APPLICATION

This application is a continuation of U.S. patent application Ser. No. 09/973,854 filed Oct. 9, 2001 now U.S. Pat. No. 6,736,926 and titled "INLINE MONITORING OF PAD LOADING FOR CuCMP AND DEVELOPING AN ENDPOINT TECHNIQUE FOR CLEANING," which is incorporated herein by reference in its entirety.

BACKGROUND OF THE INVENTION

1. Field of the Invention

The present invention relates to semiconductor processing technology and, in particular, concerns a method of cleaning and monitoring pads used in planarizing of the surfaces of a wafer using chemical mechanical polishing.

2. Description of the Related Art

Chemical mechanical polishing or planarization (CMP) is a technique whereby surfaces, such as semiconductor substrates, are planarized by the simultaneous application of both etching and polishing processes. CMP is typically used to globally planarize surfaces such as the upper surface of a semiconductor wafer. The wafer is typically positioned within a carriage and is rotated with respect to a polishing pad. In one approach, a slurry containing abrasive particles and an etchant is interposed between the polishing pad and the surface of the semiconductor wafer that is to be planarized. The polishing pad is then brought into contact with the surface of the wafer that is to be planarized and the combination of the mechanical polishing and the etchant results in the exposed surfaces of the wafer being removed by the CMP process.

One specific technique of CMP, known as copper CMP (CuCMP), is used to remove copper (Cu) from the wafer surface. CuCMP is presently used extensively in conjunction with a copper application technique known as copper Damascene process. One method of laying metal lines and interconnects in the integrated circuits is to form a layer of metal on the wafer and chemically etch away the metal. Copper is the metal of choice over other metals such as aluminum and tungsten, due to its desirable electrical properties. Copper, however, is difficult to use in the etching technique due to its high susceptibility to corrosion during the process. Corrosion leads to unpredictable electrical properties of the resulting copper interconnects, thus making copper essentially unusable for such an application. The copper Damascene process overcomes the corrosion problem by depositing copper directly into the groove patterns of interconnects already formed within the dielectric layer of the wafer. Since the copper is not etched away chemically, copper corrosion is no longer a problem. The excess copper from the Damascene process is removed by CuCMP.

As any material is removed globally from the surface of the wafer, it is desirable to be able to stop the CMP process after a predetermined amount has been removed. Endpoint technique is a method of stopping the CMP process after a right amount of material has been removed. Typically, endpoint techniques rely on frictional properties and/or light reflecting properties of the surfaces involved in the CMP process. As a layer of material is being removed from the wafer, that layer exhibits certain friction and reflectivity. When that layer is polished off and a new layer is exposed, friction between the pad and the wafer surface changes. Also, the reflectivity of the surface changes when the new layer is exposed. The CMP system can detect either or both of these changes and establish an endpoint. One of the parameters that aids in accurate endpoint technique is the removal rate that depends on the condition of the polishing pad.

One of the problems associated with the CuCMP is that slurries used in the CuCMP process are highly reactive with copper, and the various copper byproducts end up being lodged in the pad. As the copper is removed, copper byproducts are formed and begin to clog the pores and grooves on the pad. As the pores and the grooves get clogged, the slurry cannot flow uniformly throughout the surface of the pad, and glazing may occur at various locations, thus causing a non-uniform removal rate of the pad. To overcome this problem, pads are typically cleaned prior to use on a wafer.

Pad cleaning involves restoring the surface of the pad followed by chemically rinsing away the copper byproducts from the pad. The surface is restored typically by using a diamond grinding disk that comes into contact with the pad in a manner similar to that of the silicon wafer being planarized. The abrasive diamond grinding disk breaks up any glaze that may have formed on the pad's surface, and also restores a desired roughness of the pad's surface. Once the surface is mechanically restored, residual particles and the copper byproducts from the pores and grooves are dissolved away using a rinse solution. A typical rinse solution comprises a 5% ammonium citrate solution.

Despite cleaning prior to each use, pads used in CuCMP still show drifts in removal rate, and recent data show that amount of copper byproducts absorbed in the pad increases over time as the pad is cycled between cleanings and uses. Some of the methods used to measure such data are disclosed in technical publications such as "Cu dissolution from Si(111) into an SC-1 process solution", D. Chopra et al., Journal of Electrochemical Society, Vol. 145, No. 4, 1998, and "An optical method for monitoring metal contamination during aqueous processing of silicon wafers", D. Chopra et al., Journal of Electrochemical Society, Vol. 145, No. 5, 1998. Such measurements indicate that the present method of cleaning of pad does not remove the copper byproducts sufficiently. Furthermore, a fabricator using a typical conventional pad cleaning method does not know the actual condition of the pad.

While the current method of cleaning the pads for use in CuCMP process does remove copper byproducts, it is desirable that there be a more consistent method of cleaning and monitoring the pad. In particular, it is desirable to have a method of determining the concentration of the copper byproducts lodged in the pad accurately so that a fabricator can better understand the cleaning process so as to form an endpoint technique in the cleaning process. Additionally, it is desirable to map out the condition of the entire pad boundary so as to be able to achieve uniform cleaning that will lead to uniform removal of material from the wafer. By knowing the copper byproduct concentration over the entire boundary of a given pad, a proper cleaning and a proper endpoint technique can be worked out for that particular pad to yield a predictable and uniform removal rate, thus yielding a higher quality planarized wafer.

SUMMARY OF THE INVENTION

The aforementioned needs are satisfied by a system for cleaning a chemical mechanical polishing (CMP) pad. According to one aspect of the invention, the system comprises a CMP pad that is used to perform the CMP process on a device. The system further comprises a carriage that holds the device such that the CMP pad and the carriage are rotatable with respect to each other so as to allow the device to come in contact with the CMP pad. The system further comprises a slurry supply system that supplies slurry to the interface between the CMP pad and the device such that the combination of the slurry and the rotational movement between the CMP pad and the device results in removal of material from the device. The system further comprises a cleaning pad that rotates with respect to the CMP pad, and a cleaning solution supply system that supplies cleaning solution to the interface between the cleaning pad and the CMP pad. The combination of the cleaning solution and the rotational movement between the cleaning pad and the CMP pad results in removal of contaminants from the CMP pad. The system further comprises a cleaning solution analyzing system that analyzes the cleaning solution after the cleaning solution has been introduced to the interface between the CMP pad and the cleaning pad and determines, based upon the analysis the cleanliness of the CMP pad.

In the preferred embodiment of the invention, the material removed from the device is copper metal, and the CMP pad and the slurry are adapted to remove copper from the device. The cleaning pad is an abrasive diamond impregnated disk, and the cleaning solution comprising 5% ammonium citrate spiked with nitric acid is adapted to remove the copper oxides from the CMP pad. The cleaning solution analyzing system comprises an optical analyzing system and a chemical analyzing system. The optical analyzing system comprises a light source and a light detector. The light source directs a light into the cleaning solution towards the light detector, wherein the light detector detects changes to the light induced by the cleaning solution. One change induced by the cleaning solution is a change in the refraction of the light due to refractive index being dependent on concentration of ions from the contaminants. Another change induced by the cleaning solution is a change in the absorption of the light, wherein the absorption depends on the concentration of the contaminants. The chemical analyzing system samples the cleaning solution and also determines the concentration of the contaminants.

Another aspect of the invention comprises a system for analyzing the cleanliness of a CMP pad that is cleaned by a combination of mechanical abrasion and a cleaning solution. This analyzing system comprises a light source that projects a beam of light into the cleaning solution flow after the cleaning solution has been introduced onto the CMP pad during and after the mechanical abrasion. The analyzing system further comprises a detector that receives the light from the light source, and a controller that receives signals from the detector that are indicative of at least one characteristics of the light that is travelling through the cleaning solution flow. The controller determines the cleanliness of the CMP pad based upon the signals received from the detector.

In the preferred embodiment of the analyzing system, the beam of light is a beam of HeNe laser, and the detector is a pin-diode array that can resolve the detected beam of light spatially and by intensity. The signals from the detector comprise a change in the location and a change in the intensity of the detected beam of light, wherein the changes are induced by refraction and absorption of the light, respectively, in the cleaning solution flow in a manner described above.

In a preferred method of cleaning a CMP pad to remove contaminants, a cleaning pad is positioned adjacent the CMP pad and moved relative the CMP pad. Preferably, the cleaning pad is an abrasive diamond disk. As the cleaning pad is moved relative the CMP pad, a cleaning fluid is provided to the interface between the cleaning pad and the CMP pad so as to facilitate the cleaning. Preferably, the fluid comprises 5% ammonium citrate spiked with nitric acid. During the cleaning process, the cleaning fluid is evaluated to determine the condition of the CMP pad. Preferably, measurements of optical properties and chemical composition of the cleaning fluid yield a fluid characteristic value that is indicative of the condition of the CMP pad. Specifically, a change in the refractive index of the fluid is indicative of a change in the concentration of contaminants in the fluid. Also, a change in the absorption of light in the fluid is indicative of a change in the concentration of contaminants in the fluid. Preferably, measurement of the concentration of the contaminants in the fluid is performed chemically also.

From the foregoing, it will be appreciated that the process of the present invention allows for cleaning of the CMP pad in a manner such that the cleanliness of the CMP pad can be monitored. These and other objects and advantages of the present invention will become more apparent from the following description taken in conjunction with the accompanying drawings.

DETAILED DESCRIPTION OF THE PREFERRED EMBODIMENT

Figure 1:
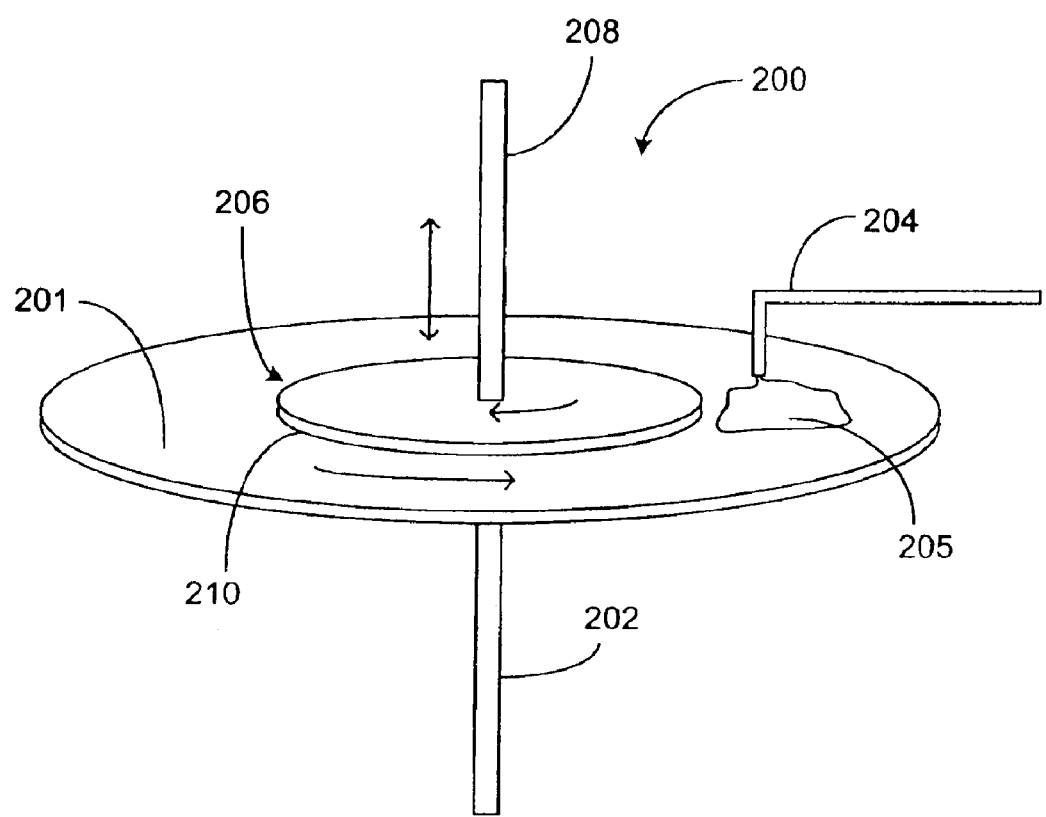
FIG. 1 is a schematic illustration of an exemplary CMP device.

Reference will now be made to the drawings wherein like numerals refer to like parts throughout. FIG. 1 schematically illustrates a manner in which chemical mechanical polishing (CMP) is often performed on a semiconductor wafer 210. As shown in FIG. 1, a typical CMP system 200 includes a rotating polishing pad 201 that is rotated by a shaft 202 attached to a motor (not shown). The pad 201 may comprise a relatively soft and porous material, such as a plastic like polyurethane, and a slurry 205 is provided by a supply tube 204 to the pad 201 while the pad 201 is rotated. The slurry 205 provided by the tube 204 is typically comprised of an abrasive material, such as alumina or silica particles, that is encapsulated within an etchant liquid and also, possibly, a suspension fluid. The exact composition of the slurry 205 will vary depending on the material that is to be removed from the wafer via the CMP process. The slurry is typically distributed throughout the pad 201 by a plurality of grooves formed in the pad 201, and the porous material of the pad 201 retains the slurry during the CMP process.

The CMP system 200 also includes a rotatable wafer carrier 206 that is rotatable about a shaft 208 by a motor (not shown). The wafer 210 is attached to the carrier 206 so that the wafer 210 can be positioned against the pad 201 in the manner schematically illustrated in FIG. 1. The wafer carrier 206 and the pad 201 are moveable with respect to each other so that the plane of the pad 201 can be positioned against the plane of the wafer 210 that is positioned within the carrier 206. When the wafer 210 is positioned proximate the pad 201, the surface of the wafer 210 adjacent the pad 201 is preferably planarized by the combination of the abrasive polishing the surface of the wafer 210 and the etchant of the slurry 205 chemically interacting with the materials on the exposed surface of the wafer 210.

The CMP process removes material from the wafer 210 until an endpoint is reached. The endpoint occurs when a desired amount of material has been removed from the wafer 210. One technique of determining the endpoint is to monitor the friction between the pad 201 and the wafer 210. Endpoints are typically situated near the boundaries of layers, where each layer is composed of different material. Friction between the pad 201 and the surface of the wafer 201 is measurably different for the different materials at the surface of the wafer 201. Thus, a change in the friction between the pad 201 and the wafer 210 is indicative of a boundary being crossed, at which point the endpoint is reached. Change in the friction between the pad 201 and the wafer 210 is detected by monitoring the currents that are drawn by the motors used to rotate the pad 201 and the wafer 210.

Another technique of determining the endpoint is to detect a change in the reflectivity of the surface of the wafer 210 as material is being removed. Different surface materials have measurably different reflectivity values that can be measured in a manner known in the art. Thus change in the reflectivity at the surface of the wafer 210 is indicative of having reached the endpoint.

One type of material often removed by CMP from the wafer 210 is metal. Metals are used in semiconductor wafers 210 to form interconnects in integrated circuits. Copper is the metal of choice as far as electrical properties are concerned; however, copper is not applied using typical methods of metal application to the wafers 210. A typical method of metal application to the wafer 210 for metals such as aluminum and tungsten is to first deposit a layer of the metal on the surface of the wafer 210. Using a lithography method well known in the art, the metal layer is selectively chemically etched away to leave patterns of interconnects. The chemicals typically used in most metal etching processes are often highly corrosive to the copper metal, resulting in interconnects with unpredictable electrical properties. Because of copper's susceptibility to corrosion to the etching chemicals, copper is generally not applied to form conductors using typical lithography pattern and etch methods.

Recent developments in semiconductor fabrication techniques have increased the use of copper. A process known as Damascene process allows forming of interconnects in the wafers 210 without using the lithography technique described above. In the Damascene process, groove patterns are formed in a dielectric layer of the wafer 210, such that the groove patterns match the desired interconnect patterns. Metal is then deposited directly into the grooves such that once the grooves are filled, the desired interconnects are formed without the etching chemical intervention. Thus, the Damascene process allows for the use of copper to form the interconnects. Excess metal layer at the top of the filled grooves is removed by the CMP process. In particular, a specific type of the CMP process known as copper CMP (CuCMP) is used in conjunction with the Damascene process involving copper. As the name implies, CuCMP is geared towards removal of copper from the surface of the wafer 210.

It will be appreciated that the Damascene process is not restricted to application of copper. Furthermore, CuCMP process is not restricted to use in conjunction with the Damascene process. However, due to the great advantages afforded by the use of copper and the Damascene process, copper usage is generally associated with the Damascene process, and in turn, CuCMP is generally associated with the Damascene process.

Figure 2A:
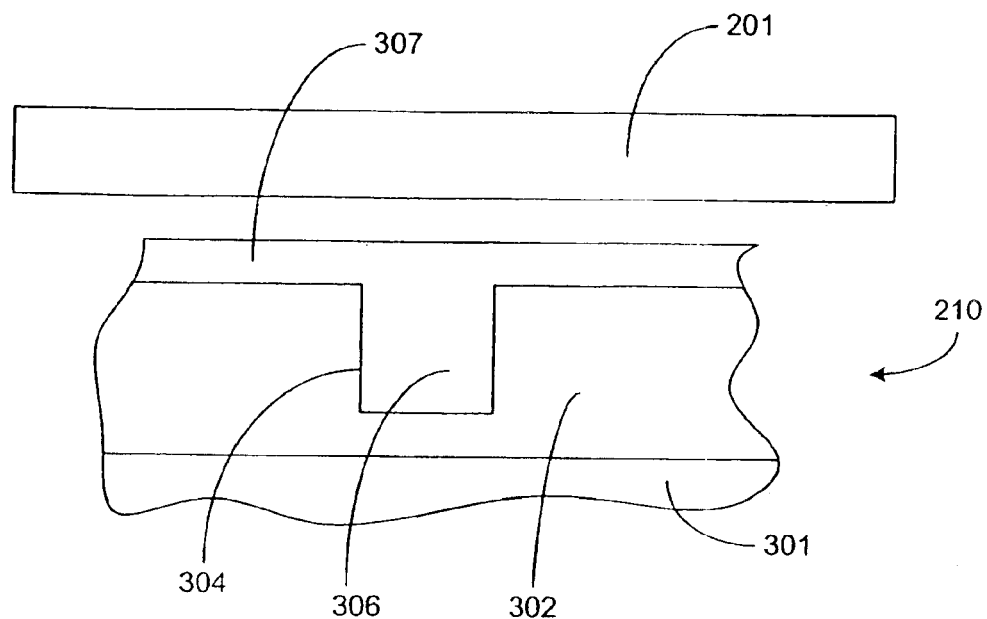
FIG. 2A is a schematic illustration of a CuCMP process about to remove excess copper from a surface of a wafer after copper was deposited by a Damascene process.
Figure 2B:
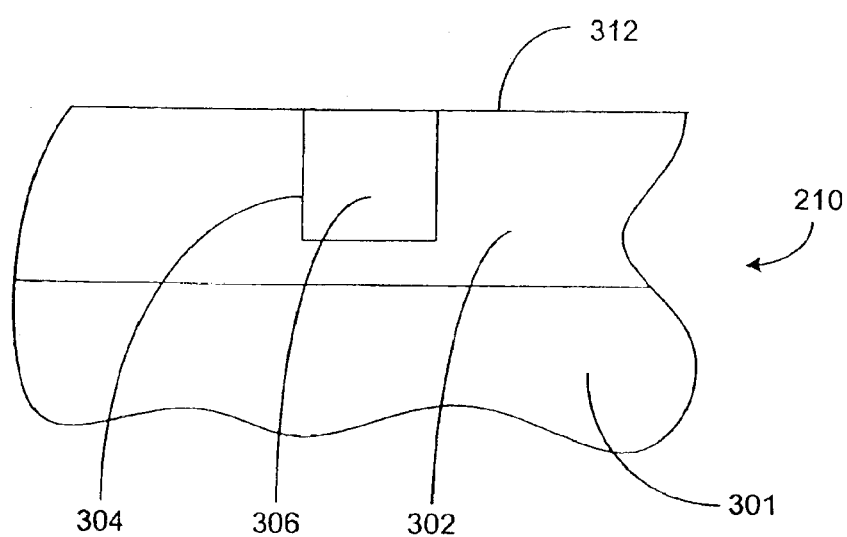
FIG. 2B is a schematic illustration of the planarize wafer after removing the excess copper by the CuCMP process.

FIGS. 2A and 2B schematically illustrate the CuCMP process. As illustrated in FIG. 2A, a dielectric layer 302 is initially positioned on a substrate 301 using typical deposition techniques. The dielectric layer 302 can consist of any of a number of insulative materials such as silicon oxide ($SiO_2$). After the dielectric layer 302 is formed, a conductor receiving space, such as a groove 304 is formed in the dielectric layer 302 using well known patterning and etching processes. The conductor receiving space in this embodiment is comprised of a groove for a lateral interconnect. However, it will be appreciated that the conductor receiving space can comprise such things as grooves, vias and the like without departing from the spirit of the present invention.

In FIG. 2A, the surface of the wafer 210 has gone through the Damascene process, and one of the plurality of grooves is illustrated. The groove 304 in the dielectric substrate 302 is filled with copper 306 by the Damascene process such that copper is globally deposited over the dielectric layer 302 using a known metal deposition technique in the manner described above. A layer of excess copper 307 is about to be removed by the pad 201 using a known CuCMP process. FIG. 2B illustrates the wafer 210 after the CuCMP process has reached the endpoint, where the excess copper layer 307 has been removed completely to yield a planarized surface 312. As is illustrated in FIG. 2B, the excess copper 307 is removed until the end-point determination technique has indicated that the upper surface 312 of the dielectric layer 302 has been exposed.

One of the problems associated with the CuCMP process is that the slurries 205 used are highly reactive with copper, and various copper byproducts end up being lodged in the pad 201. The copper byproducts, such as copper oxides CuO and Cu2O, clog the grooves and the pores at the surface of the pad 201 such that the slurry 205 does not get distributed evenly and be retained by the pad 201. Furthermore, the pad 201 may form a glazed surface when used for a period of time with poorly circulated slurry 205. Degradation of the pad 201 results in the removal rate and the uniformity of the pad 201 being unpredictable, both of which are critical for accurate endpoint determination and quality of the planarized surface. To overcome this problem, pads 201 laden with copper oxides are cleaned prior to use on the wafers 210.

Figure 3:
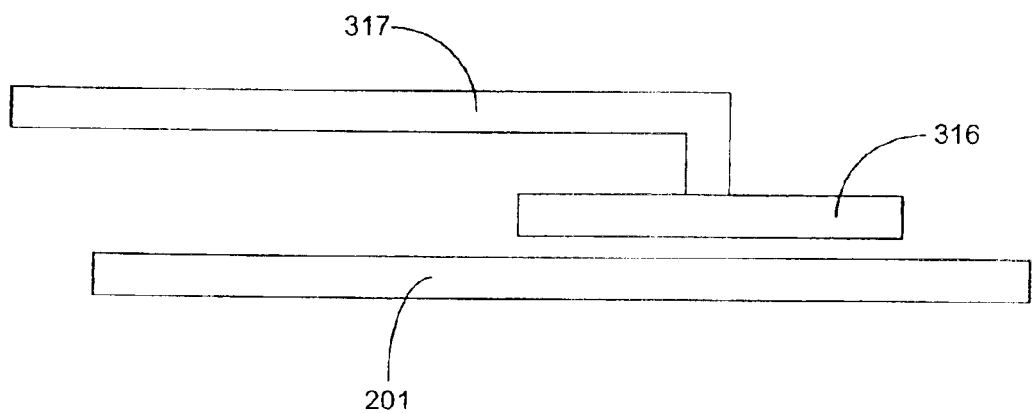
FIG. 3 is a schematic illustration of a CMP pad being cleaned by an abrasive disk such as a diamond disk.

Typical cleaning of the pad 201 comprises two stages. First, the pad 201 is mechanically cleaned by an abrasive surface such as a diamond disk 316, as schematically illustrated in FIG. 3. In this process, the diamond disk 316 attached to a grinder arm 317 that is adapted to allow the diamond disk 316 to rotate, move over the surface of the pad 201, and come in contact with the pad 201. The grinding action of the diamond disk 316 removes the glaze that may have formed at the surface of the pad 201, and also leaves a desired "roughness" on the surface. During the grinding process, a rinse solution is introduced between the diamond disk 316 and the pad 201 to rinse away the debris removed, and to aid in obtaining the desired texture of the pad 201.

Figure 4A:
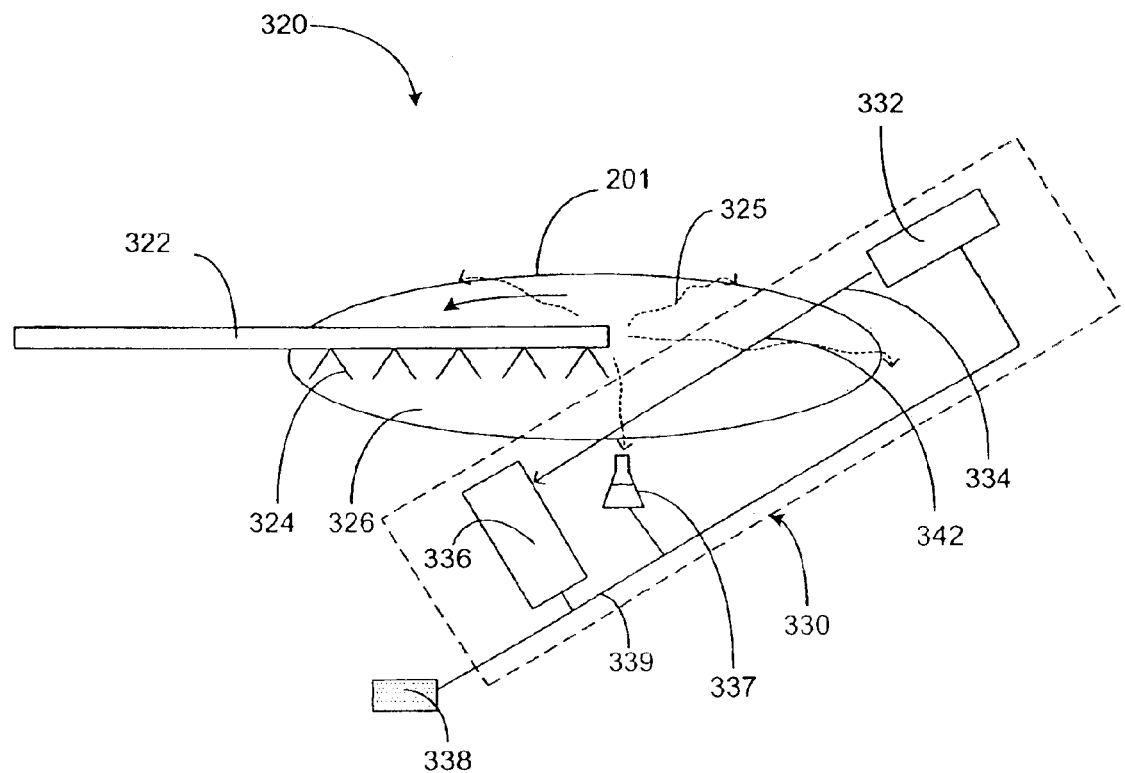
FIG. 4A is a schematic illustration showing a perspective view of the pad being chemically cleaned by a chemical solution to dissolve the contaminants in the pad.

Following the first stage of mechanical cleaning of the surface, the pad 201 is further cleaned by a chemical cleaning solution 324 as schematically illustrated in FIG. 4A. The cleaning solution 324, such as a 5% ammonium citrate solution, is introduced to the surface of the pad 201 through a rinse arm 322. The pad 201 rotates as indicated to distribute the cleaning solution 324 that is being continuously introduced such that a cleaning solution layer 326 runs off the pad 201 as indicated by flow patterns 325. Typically, this process continues for a predetermined amount of time, and the copper oxides are dissolved out of the pores and the grooves of the pad 201. One aspect of the preferred embodiment of the present invention is illustrated in FIG. 4A to monitor the cleaning process, and is described in detail below.

Despite such cleaning comprising two stages prior to each use, pads 201 used in CuCMP process still have a tendency to drift in removal rate and uniformity. Recent data show that amount of copper oxides retained in the pad 201 increases over time as the pad 201 is cycled between cleanings and uses, indicating that the present method of cleaning pads does not remove the copper oxides sufficiently. Furthermore, removal of copper oxides from the pad 201 is not well understood, such that the actual condition of the pad 201 is not known accurately prior to use.

Figure 4B:
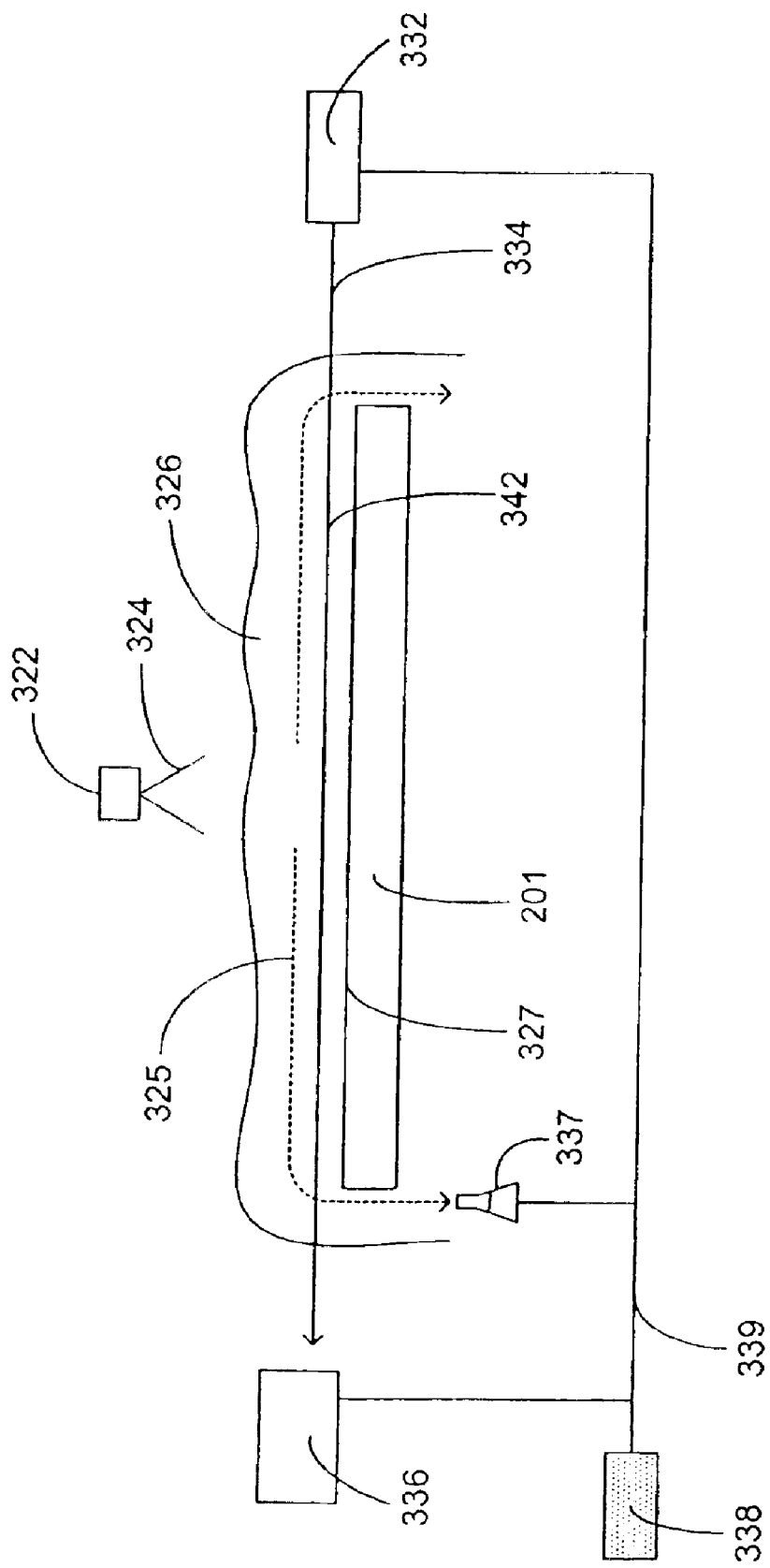
FIG. 4B is a schematic illustration showing a side view of FIG. 4A.
Figure 4C:
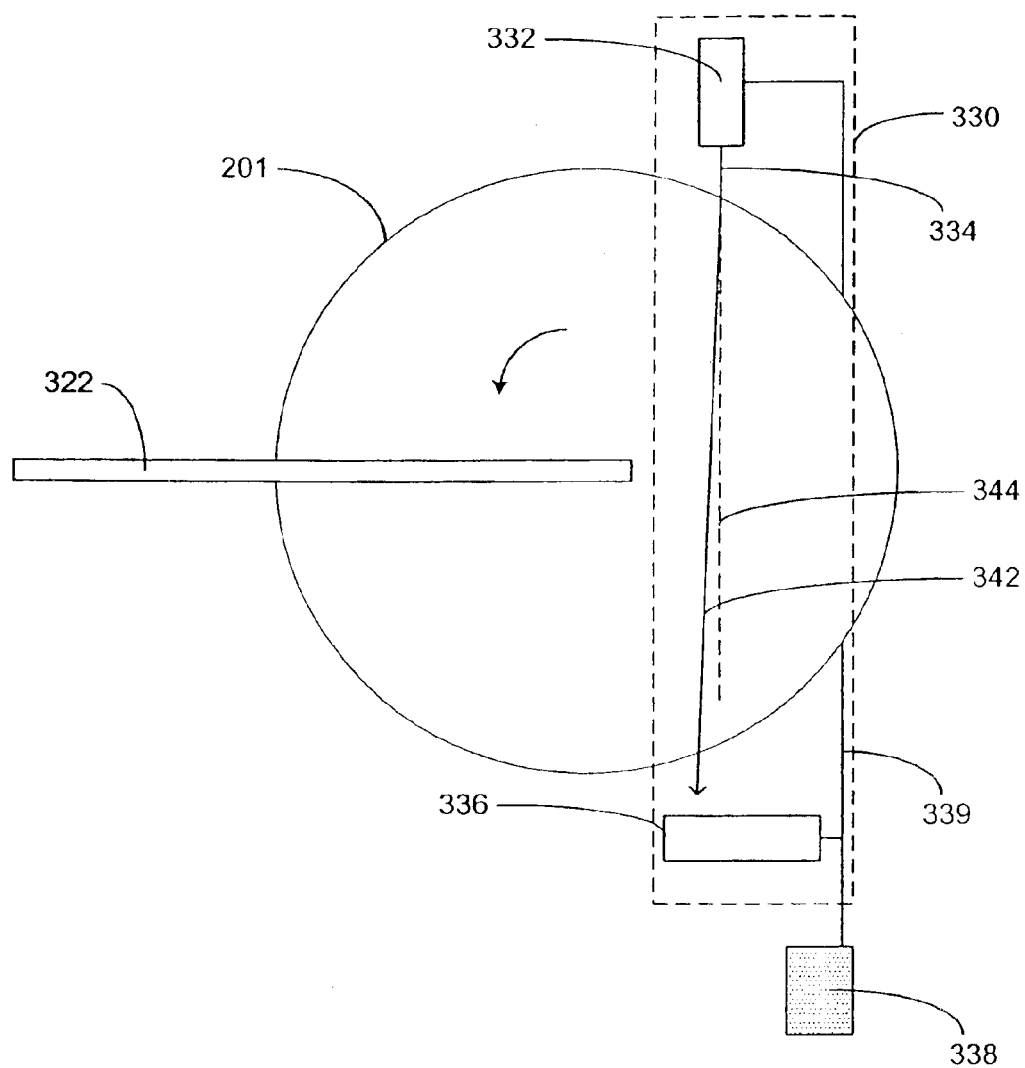
FIG. 4C is a schematic illustration showing a plan view of FIG. 4A.

FIGS. 4A, 4B, and 4C schematically illustrate one aspect of the preferred embodiment of the present invention that monitors the chemical cleaning described above. FIG. 4A depicts a perspective view of a pad cleaning system 320. The cleaning system 320 comprises the rinse arm 322 that delivers the cleaning solution 324 to the pad 201 at a fixed rate. The cleaning system 320 further comprises the pad 201 that is attached to a carriage (not shown) so as to allow the pad 201 to rotate with respect to the rinse arm, as indicated in FIG. 4A. The rotating motion of the pad 201 allows the cleaning solution 324 to be distributed evenly on the surface of the pad 201, and chemically clean the pad in a manner described in detail below. As the cleaning solution 324 is added to the pad 201, excess fluid is allowed to run off the edge of the pad as depicted by the flow patterns 325. The cleaning system 320 further comprises a monitoring assembly 330 that is described in detail below.

The cleaning solution 324 is delivered to the surface of the rotating pad 201 through the rinse arm 322 at a fixed rate, such that a layer of cleaning solution 326 is formed on the surface of the pad 201, and excess fluid runs off the edge of the pad 201. This layer of cleaning solution 326 is better illustrated in FIG. 4B. The monitoring assembly 330 comprises a light analyzer (332, 334, 342, 336) and a chemical analyzer 337 to determine the state of the cleaning process. The light analyzer comprises a light source 332, light beams 334 and 342, a light detector 336, and a monitor carriage (348 shown in FIG. 6) adapted to allow the light source 332 and the light detector 336 to be moved with respect to the wafer 201. The chemical analyzer 337 analyzes the excess fluid that runs off the edge of the pad 201 in a manner described below.

In operation of the light analyzer, the light source 332 projects a beam of light 334 that enters the layer of cleaning solution 326 as illustrated in FIG. 4B. The beam of light 334 is refracted in the layer of cleaning solution 326 according to the refractive index of the solution layer 326. Refraction of the beam of light 334 yields a refracted beam 342 in the solution 326. In FIG. 4C, the refracted beam 342 is shown in relation to a projected line 344 that is an extension of the beam of light 334. The refracted beam 342 exits the solution 326 and is detected by the light detector 336. The monitoring assembly 330 is adapted such that the light detector 336 can detect the amount of deflection of the refracted beam 342, from which the refractive index of the solution 326 can be determined.

A controller 338, as illustrated in FIGS. 4A, 4B, and 4C, controls the operation of the monitoring assembly 330. The outputs from the chemical analyzer 337 and the light detector 336 are processed by the controller 338 to determine the condition of the pad 201.

In the preferred embodiment of the invention, the light source 332 is a laser such as a HeNe laser, and the light detector 336 is a pin diode array (PAD) capable of spatially resolving small changes in the deflection of the beam 342. The fresh cleaning solution 324 is a 5% ammonium citrate rinse solution spiked with nitric acid. As the layer of cleaning solution 326 dissolves the copper oxides from the pad 201, the copper ion concentration in the solution 326 increases. In general, an increase in ion concentration in an aqueous solution increases the refractive index of the solution in a linear fashion up to a certain point. Thus, as the copper ion concentration increases in the solution 326, the refractive index increases, and the refracted beam 342 is deflected more. The monitoring assembly 330 can therefore monitor the copper ion concentration of the solution continuously.

Figure 5A:
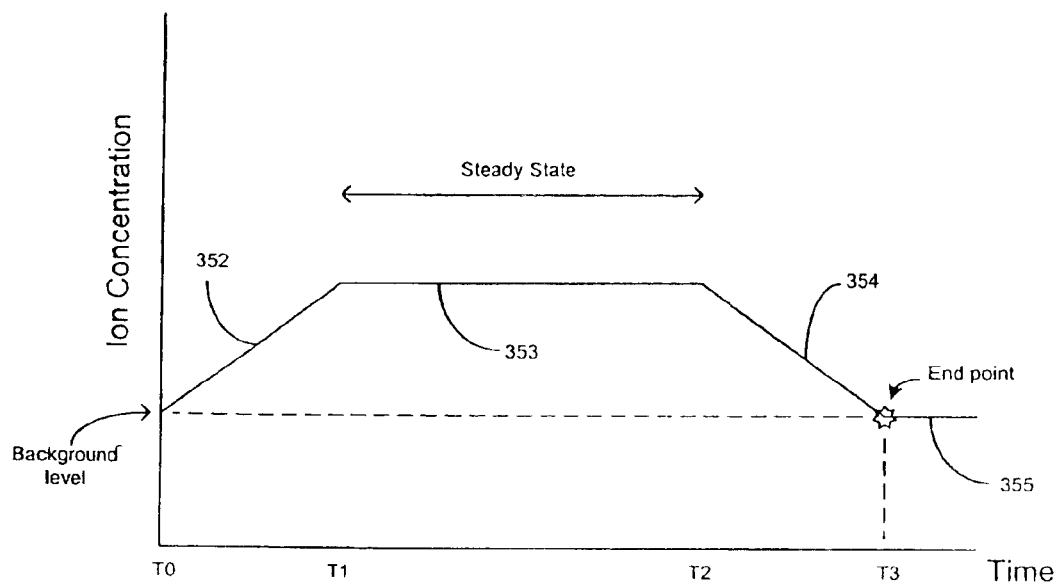
FIG. 5A is an illustration of an exemplary plot of copper ion concentration in the chemical solution as a function of time during the chemical cleaning of the pad.

FIG. 5A illustrates a plot of copper ion concentration in the solution 326 as a function of time during the chemical cleaning process. At the beginning of the cleaning process, denoted by time T0 in FIG. 5A, fresh cleaning solution 324 is introduced onto the surface of the pad 201, and forms the layer of solution 326. The solution 326 begins to dissolve the copper oxides from the pad 201 to form copper ions in the solution 326. As the fresh cleaning solution 324 is continuously added onto the surface of the pad 201 at a constant rate, the ion concentration in the solution 326 will be diluted. At the same time, the copper ions are being generated from dissolving of the copper oxides from the pad 201. The net effect is an increase in the ion concentration in the solution 326, as depicted by curve 352 in FIG. 5A, until a steady state is reached at time T1. This is a state where the rate of dilution is equal to the rate of ion production, and the ion concentration essentially remains constant during this phase, as depicted by curve 353 between T1 and T2. As the solution 326 dissolves away the copper oxides from the pad 201, the pad 201 becomes cleaner, and the copper oxides content of the pad 201 begins to decrease, resulting in decrease of the ion production rate. Thus, the net ion concentration in the solution 326 decreases, as shown by curve 354 between T2 and T3, until the ion concentration levels off to a background level depicted by curve 355. Beyond time T3, the ion production rate is negligible compared to the dilution rate, and the pad 201 is now "clean" as far as removal of copper oxides is concerned.

Knowing the ion concentration in the solution 326 allows determination of an endpoint for the chemical cleaning. FIG.

5A illustrates an exemplary endpoint situated at time T3 where the ion concentration has been restored to the background level similar to that encountered at time T0.

Figure 5B:
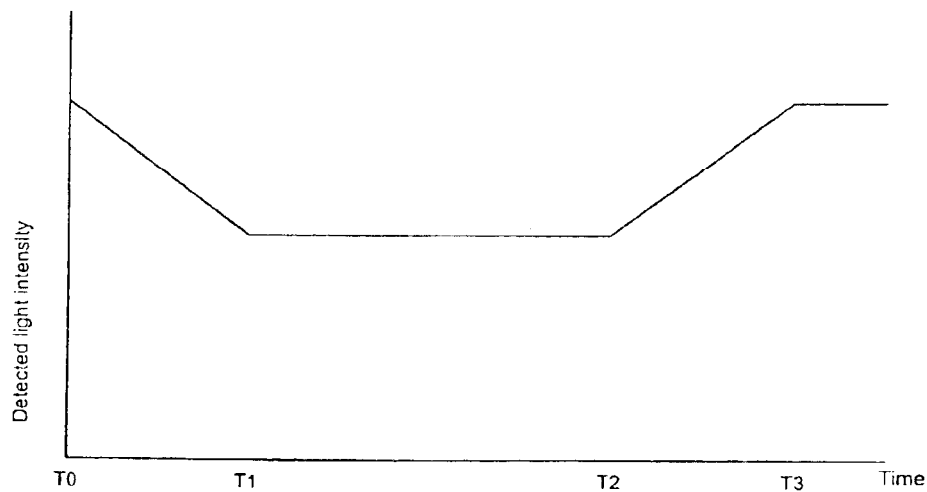
FIG. 5B is a plot of intensity of light that has passed through the chemical solution as a function of time corresponding to the process illustrated in FIG. 5A.

The light detector 336, in addition to spatially resolving the refracted light 342, is sensitive to the intensity of the light it detects. Typically, absorption of light is proportional to the concentration of dissolved ions in a solution. Thus, the intensity of detected light at the light detector 336 is indicative of the ion concentration in the layer of solution 326 in an inverse manner. A plot of detected light intensity as a function of time, as depicted in FIG. 5B, shows a behavior that tracks the plot of ion concentration as a function of time (FIG. 5A) in an inverse manner. Thus, the intensity measurement gives a second measurement to monitor the chemical cleaning process.

Furthermore, as illustrated in FIGS. 4A and 4B, the monitoring assembly 330 includes the chemical analyzer 337 that analyzes the excess fluid that runs off the pad 201. The chemical analyzer 337 also monitors the concentration of copper ions in the layer of solution 326. This independent measurement of the copper ion concentration is used to further aid the determination of the endpoint for the chemical cleaning.

Aside from being able to clean the pad 201 with accurate endpoint, the pad cleaning system 320 allows determination of the overall condition of the pad 201. The duration of the steady state (time between T2 and T1 in FIGS. 5A and 5B) of the ion concentration curve is indicative of how "dirty" the pad 201 was before the chemical cleaning. Longer duration of the steady state means more copper oxides had to be dissolved away.

Figure 6:
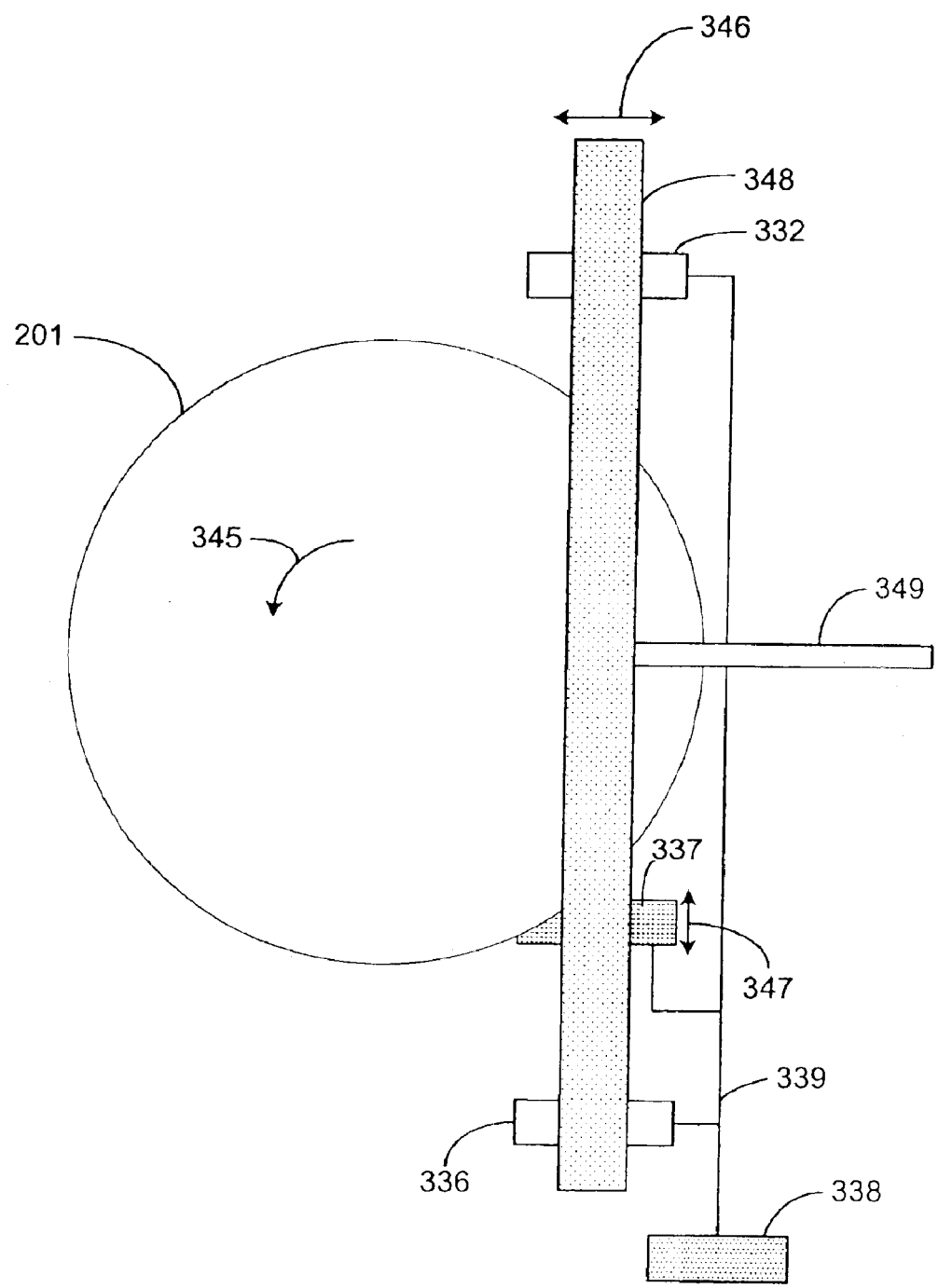
FIG. 6 is a schematic illustration showing a carriage that allows cleaning system to be moved with respect to the pad.

FIG. 6 schematically illustrates the preferred embodiment of the invention further comprising the monitor carriage 348 and a monitor carriage arm 349 adapted so as to allow the monitor assembly 330 (FIG. 4C) to be moved with respect to the pad 201. The monitor carriage 348 further adapted so as to allow the chemical analyzer 337 to move along the monitor carriage 348 as indicated by an arrow 347, wherein the position of an input receptacle of the chemical analyzer 337 that collects the runoff cleaning solution is preferably always at the edge of the pad 201. An exemplary motion of the monitor carriage 348 is illustrated by an arrow 346. In one embodiment of the invention, the pad may stop rotating, and the monitor carriage 348 sweeps half of the pad 201 starting from the right side to the middle of the pad 201. Then, the pad 201 is rotated partially in the direction indicated by an arrow 345, and the monitor carriage 348 again sweeps half of the pad 201. This process continues until substantially all of the pad 201 is swept by the monitor carriage 348. This allows the cleaning system 320 to sample one area of the pad 201, or many areas of the pad 201 by selectively moving the monitor assembly 330 over that pad 201 to map the condition of the pad 201. The mapped condition of the pad 201, determined by the methods utilizing refraction, absorption, and chemical analysis as described above, further aids the operator to work out the proper endpoint method so as to improve the process and result of the CuCMP.

It will be appreciated that in one embodiment of the invention, the CMP system illustrated in FIG. 1, the mechanical pad cleaning system illustrated in FIG. 3, and the chemical pad cleaning system illustrated in FIGS. 4A, 4B, 4C, and 6 may be adapted so as to allow all three systems to be integrated into a single unit.

Figure 7:
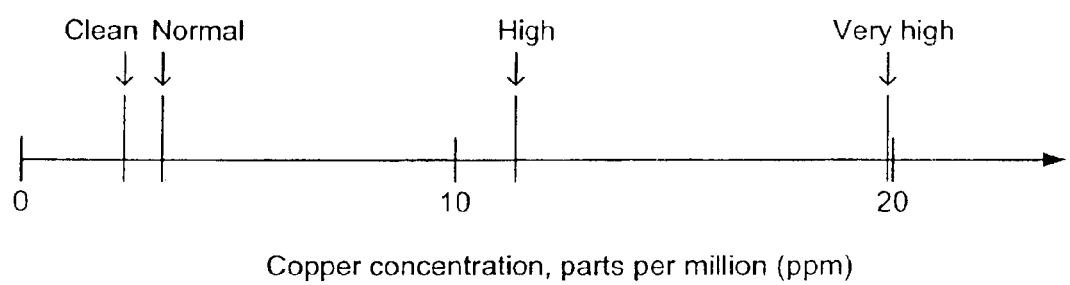
FIG. 7 illustrates an exemplary scale that grades cleanliness of the pad based on the of copper concentration in the chemical solution.

FIG. 7 illustrates a scale of copper concentration in the layer of solution 326 adjacent the pad 201, indicating typical cleanliness markers. Copper concentration of 2.4 parts per million (ppm) or less for some applications is considered to be clean. A value of 3.3 ppm is considered to be a normal usable cleanliness for these applications, whereas a value of 11.4 ppm is considered to be high. A value of 19.9 ppm is considered to be very high. In practice, a uniform copper concentration throughout the pad 201, anywhere in the range between 3 and 11 ppm usable for uniform planarization. The pad 201 with copper concentration of 3 ppm throughout would be considered ideal. Also, the pad 201 with copper concentration of 11 ppm throughout, while not as ideal as that with 3 ppm, is still usable for obtaining uniform planarization. On the other hand, the pad 201 that exhibits a gradient in the copper concentration throughout the pad 201 will yield non-uniform planarization. For example, even though the range of 3 to 11 ppm is considered to be usable, the pad 201 that has a center to edge gradient of 8 ppm (3 to 11 ppm) may lead to unacceptable uniformity result.

Thus, it will be appreciated that the preferred embodiment of the present invention allows not only globally monitoring the chemical cleaning of the pad 201, but also the profile of the cleanliness throughout the pad 201. As such, the operator can establish the endpoint that corresponds to the actual condition of the pad 201.

Although the foregoing description of the preferred embodiment of the present invention has shown, described and pointed out the fundamental novel features of the invention, it will be understood that various omissions, substitutions and changes in the form of the detail of the apparatus illustrated, as well as the uses thereof, may be made by those skilled in the art without departing from the spirit of the present invention. Consequently, the scope of the invention should not be limited to the foregoing discussion, but should be defined by the appended claims.

What is claimed is:

1. A chemical mechanical polishing (CMP) system, comprising:

a CMP pad;

a carriage that holds at least one device, wherein the CMP pad and carriage are rotatable with respect to each other and movable with respect to each other such that when the at least one device is positioned within the carriage the at least one device can be brought into contact with the CMP pad;

a slurry supply system that supplies a slurry to an interface between the CMP pad and the at least one device such that the combination of the slurry and the movement between the CMP pad and the at least one device results in removal of material from the at least one device;

a cleaning pad that rotates with respect to the CMP pad;

a cleaning solution supply system that supplies a cleaning solution to the interface between the cleaning pad and the CMP pad wherein the combination of the cleaning solution and the movement between the cleaning pad and the CMP pad results in removal of contaminants from the CMP pad;

a cleaning solution analyzing system that analyzes the cleaning solution after the cleaning solution has been introduced to the interface between the CMP pad and the cleaning pad and determines, based upon the analysis the cleanliness of the CMP pad following the supply of the cleaning solution to the interface; and a carriage that moves the cleaning solution analyzing system with respect to the CMP pad to permit periodic evaluation of the cleanliness of the CMP pad following CMP of the at least one device.

2. The system of claim 1, wherein the material removed from the device is metal.

3. The system of claim 2, wherein the metal is copper.

4. The system of claim 1, wherein the CMP pad and the slurry are adapted to remove copper from the device.

5. The system of claim 1, wherein the cleaning pad is an abrasive grinding disk.

6. The system of claim 5, wherein the abrasive grinding disk is a diamond impregnated disk.

7. The system of claim 1, wherein the cleaning solution is adapted to remove the copper oxides from the CMP pad.

8. The system of claim 7, wherein the cleaning solution comprises an ammonium citrate solution.

9. The system of claim 8, wherein the cleaning solution comprises an approximately 5% ammonium citrate solution.

10. The system of claim 8, wherein the cleaning solution contains nitric acid by an amount in a range of approximately 0.001% to approximately 0.5% by weight.

11. The system of claim 1, wherein the cleaning solution analyzing system comprises an optical analyzing system and a chemical analyzing system, the optical analyzing system comprising a light source and a light detector, wherein the light source directs a light into the cleaning solution towards the light detector, wherein the light detector detects changes to the light induced by the cleaning solution.

12. The system of claim 11, wherein the changes to the light induced by the cleaning solution comprise changes in refraction and absorption.

13. The system of claim 12, wherein the refraction and absorption of the light depend on the concentration of ions in the cleaning solution.

14. The system of claim 13, wherein the ions are copper ions from dissolved copper oxides.

15. The system of claim 11, wherein the chemical analyzing system samples the cleaning solution and determines the concentrations of the contaminants.

16. A CMP pad analysis system, comprising:
a light source that projects a beam of light into a flow of a cleaning solution after the cleaning solution has been introduced onto the pad during and after a mechanical abrasion of the pad;
a detector that receives the light from the light source;
a carriage that is coupled to the light source and detector so as to move the light source and the detector relative to the pad to permit an analysis of the cleanliness of the pad while the pad is being used for chemical mechanical polishing of one or more devices; and
a controller that receives signals from the detector, said signals being indicative of at least one characteristic of the light that is travelling through the cleaning solution flow, wherein the controller determines the cleanliness of the pad based upon the signals received from the detector.

17. The system of claim 16, wherein the beam of light comprises a beam of HeNe laser.

18. The system of claim 16, wherein the detector comprises a pin-diode array that can resolve the detected beam of light spatially and by intensity.

19. The system of claim 16, wherein the signals from the detector comprise a change in the location and a change in the intensity of the detected beam of light.

20. The system of claim 19, wherein the change in the location of the detected beam of light is caused by a change in refraction of the beam of light in the cleaning solution flow, wherein the change in refraction is caused by a change in the concentration of contaminants in the cleaning solution flow, wherein the concentration of contaminants in the cleaning solution flow is indicative of the cleanliness of the CMP pad.

21. The system of claim 19, wherein the change in the intensity of the detected beam of light is caused by a change in absorption of the beam of light in the cleaning solution flow, wherein the change in absorption is caused by the change in the concentration of contaminants in the cleaning solution flow, wherein the concentration of contaminants in the cleaning solution flow is indicative of the cleanliness of the CMP pad.

* * * * *